United States Patent
Ko et al.

(10) Patent No.: US 12,217,995 B2
(45) Date of Patent: Feb. 4, 2025

(54) METHOD OF MOUNTING CONDUCTIVE BALLS USING ELECTROSTATIC CHUCK

(71) Applicant: PROTEC CO., LTD., Gyeonggi-do (KR)

(72) Inventors: Youn Sung Ko, Chungcheongnam-do (KR); Yoshiaki Yukimori, Kanagawa (JP)

(73) Assignee: PROTEC CO., LTD., Gyeonggi-do (KR)

( * ) Notice: Subject to any disclaimer, the term of this patent is extended or adjusted under 35 U.S.C. 154(b) by 218 days.

(21) Appl. No.: 18/073,493

(22) Filed: Dec. 1, 2022

(65) Prior Publication Data

US 2023/0093905 A1 Mar. 30, 2023

Related U.S. Application Data

(63) Continuation of application No. PCT/KR2021/006836, filed on Jun. 2, 2021.

(30) Foreign Application Priority Data

Jun. 3, 2020 (KR) ........................ 10-2020-0066851

(51) Int. Cl.
*H01L 21/683* (2006.01)

(52) U.S. Cl.
CPC ................ *H01L 21/6833* (2013.01)

(58) Field of Classification Search
CPC ....... B23K 3/0623; B23K 3/082; H01L 21/48; H01L 21/4814; H01L 21/6833;
(Continued)

(56) References Cited

U.S. PATENT DOCUMENTS 5,816,481 A * 10/1998 Economy ............. H05K 3/3489
228/223
6,533,159 B1 * 3/2003 Cobbley .............. B23K 3/0623
228/41
(Continued)

FOREIGN PATENT DOCUMENTS

JP H07283521 10/1995
JP 2009187998 8/2009
(Continued)

*Primary Examiner* — Jared Fureman
*Assistant Examiner* — Nicolas Bellido
(74) *Attorney, Agent, or Firm* — JCIPRNET

(57) ABSTRACT

Provided is a conductive ball mounting method using an electrostatic chuck. According to the conductive ball mounting method using an electrostatic chuck, when the process of mounting conductive balls onto a substrate through mounting grooves formed in the mask is performed, the occurrence of process defects can be prevented and conductive balls having very small sizes can be effectively mounted on the substrate. According to the conductive ball mounting method using the electrostatic chuck of the disclosure, the process of mounting conductive balls can be performed with high quality by preventing deformation of the mask without missing of some of the conductive balls. According to the conductive ball mounting method using the electrostatic chuck of the disclosure, the process of mounting small sizes of conductive balls on the substrate can be effectively performed.

14 Claims, 3 Drawing Sheets

(58) Field of Classification Search
CPC ..... H01L 21/92604; H01L 2224/03828; H01L 2224/0401; H01L 2224/05568; H01L 2224/11334; H01L 2224/11849; H01L 2224/131; H01L 2224/742; H01L 2224/75611; H01L 2224/75621; H01L 2224/75702; H01L 2224/75725; H01L 2224/75745; H01L 24/10; H01L 24/11; H01L 24/74; H01L 24/75; H01L 24/81; H05K 3/34; H05K 3/34503; H05K 3/34505
USPC ................ 228/56.3, 41, 206, 223, 245, 246; 361/234
See application file for complete search history.

(56) References Cited

U.S. PATENT DOCUMENTS

| | | | | |
|---|---|---|---|---|
| 9,579,741 | B2* | 2/2017 | An | H01L 24/742 |
| 2002/0058406 | A1* | 5/2002 | Mukuno | H01L 21/4853 |
| | | | | 438/626 |
| 2009/0072012 | A1* | 3/2009 | Sakaguchi | H01L 24/742 |
| | | | | 228/41 |
| 2009/0159651 | A1* | 6/2009 | Sunohara | H05K 3/3478 |
| | | | | 228/41 |
| 2009/0294516 | A1* | 12/2009 | Sawa | H05K 3/3478 |
| | | | | 228/41 |
| 2015/0230346 | A1* | 8/2015 | Tanno | B23K 1/0016 |
| | | | | 228/248.1 |
| 2016/0016247 | A1 | 1/2016 | An | |
| 2020/0144219 | A1* | 5/2020 | Ko | H01L 21/67288 |
| 2020/0144220 | A1* | 5/2020 | Ko | H01L 24/74 |

FOREIGN PATENT DOCUMENTS

| | | |
|---|---|---|
| KR | 1020070056337 | 6/2007 |
| KR | 1020100061380 | 6/2010 |

\* cited by examiner

METHOD OF MOUNTING CONDUCTIVE BALLS USING ELECTROSTATIC CHUCK

CROSS-REFERENCE TO RELATED APPLICATION

This application is a continuation of international application of PCT application serial no. PCT/KR2021/006836 filed on Jun. 2, 2021, which claims the priority benefit of Korea application no. 10-2020-0066851 filed on Jun. 3, 2020. The entirety of each of the above mentioned patent applications is hereby incorporated by reference herein and made a part of this specification.

TECHNICAL FIELD

The disclosure relates to a method of mounting conductive balls using an electrostatic chuck, and more particularly, to a method of mounting conductive balls using an electrostatic chuck, by which very small conductive balls are accurately mounted on a target position on a substrate without missing any of the conductive balls.

BACKGROUND ART

When a semiconductor device, such as a large scale integration (LSI) and a liquid crystal display (LCD) is mounted, conductive balls, such as solder balls, are often used for electrical connection.

Conductive balls in the form of fine particles with a diameter of about 1 mm or less are mounted on the substrate and used for electrical mounting of the substrate. In general, conductive balls are mounted on a substrate in such a manner that a mask having a mounting groove is placed on a substrate printed with flux thereon, and conductive balls are transferred onto the substrate through the mounting groove to be temporarily bonded thereon by flux.

In recent years, as semiconductor devices are integrated and miniaturized, the size of the conductive balls has become very small, and the number of conductive balls mounted at one time using a mask has also been greatly increased.

Accordingly, there is a need for a conductive ball mounting method using an electrostatic chuck capable of effectively performing a process of mounting tens of thousands or hundreds of thousands of conductive balls having the size of smaller than 100 μm on a substrate through a mask.

When a conductive ball having a small size is mounted as described above, it is not easy to accurately mount the same at the target position on the substrate. In order to accurately mount the conductive ball at the target position on the substrate, a mask having a structure in which a mounting hole is formed in a thin metal plate is often used. However, in many cases, two conductive balls may be inserted into the mounting hole of the mask or a conductive ball may not be mounted in the mounting hole.

Various methods have been tried to effectively mount a conductive ball in a mounting hole of a mask. As described above, as a general method, a conductive ball mounted in the mounting hole of the mask is transferred above the substrate and then dropped thereonto to mount the same on the substrate.

However, as described above, in the case of a very small and light conductive ball having the size of 100 μm or less, the conductive ball may not easily come out from the mounting hole of the mask.

Therefore, there is a need for a method of mounting conductive balls using an electrostatic chuck capable of effectively mounting conductive balls in the mounting grooves of the mask at a high speed and transferring the conductive balls from the mask onto the substrate without missing a conductive ball.

DETAILED DESCRIPTION OF THE INVENTION

Technical Problem

The disclosure provides a method of mounting conductive balls using an electrostatic chuck that is capable of mounting conductive balls having small sizes onto a substrate quickly and effectively without missing any of the conductive balls.

Technical Solution to Problem

According to an aspect of the disclosure, a method of mounting conductive balls using an electrostatic chuck includes (a) horizontally arranging a mask including: a mask body in the form of a flat plate; a plurality of mounting grooves formed on a lower surface of the mask body to mount conductive balls therein; and a through hole formed inside the mounting groove and passing through the mask body; (b) placing an electrostatic chuck above the mask; (c) disposing, under the mask, a ball supply module in which a plurality of conductive balls are accommodated; (d) mounting the conductive balls accommodated in the ball supply module into the mounting grooves by operating the electrostatic chuck; (e) disposing the substrate under the mask by preparing a substrate on which flux is applied and transferring at least one of the mask and the substrate; and (f) mounting the conductive balls on the substrate by increasing the distance between the electrostatic chuck and the mask to drop the conductive balls mounted in the mounting grooves of the mask onto the substrate.

Advantageous Effects of Disclosure

According to a conductive ball mounting method using the electrostatic chuck of the disclosure, the process of mounting conductive balls can be performed with high quality without missing of some of the conductive balls.

According to a conductive ball mounting method using the electrostatic chuck of the disclosure, the process of mounting small sizes of conductive balls on the substrate can be effectively performed.

MODE OF DISCLOSURE

Hereinafter, a conductive ball mounting apparatus for performing a conductive ball mounting method using an electrostatic chuck according to the disclosure will be described in detail with reference to the drawings.

Figure 1:
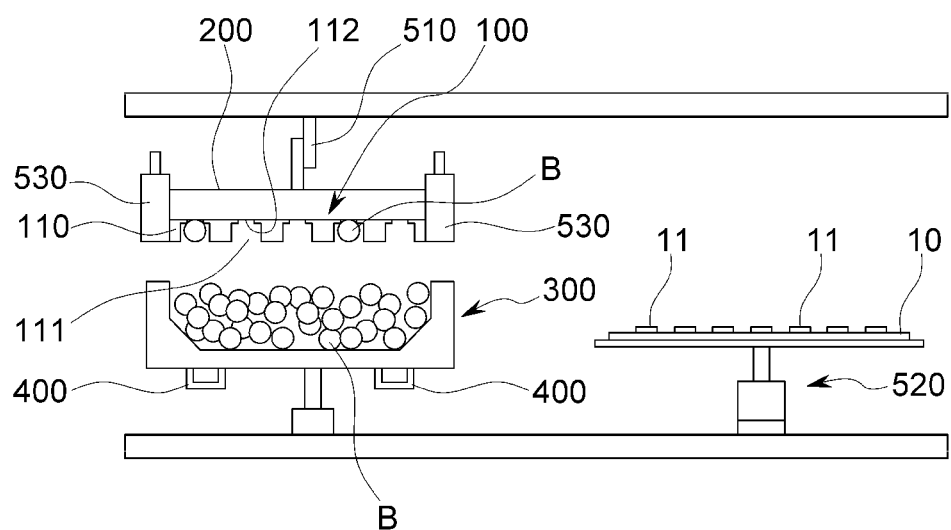
FIG. 1 shows an apparatus for mounting conductive balls to implement an example of a method of mounting conductive balls using an electrostatic chuck according to the disclosure.

FIG. 1 shows a conductive ball mounting apparatus to implement an example of a method of mounting conductive balls using an electrostatic chuck according to the disclosure.

Referring to FIG. 1, the apparatus for mounting a conductive ball B, for implementing the conductive ball mounting method using an electrostatic chuck according to an embodiment, includes a mask 100, a ball supply module 300, and an electrostatic chuck 200.

Figure 2:
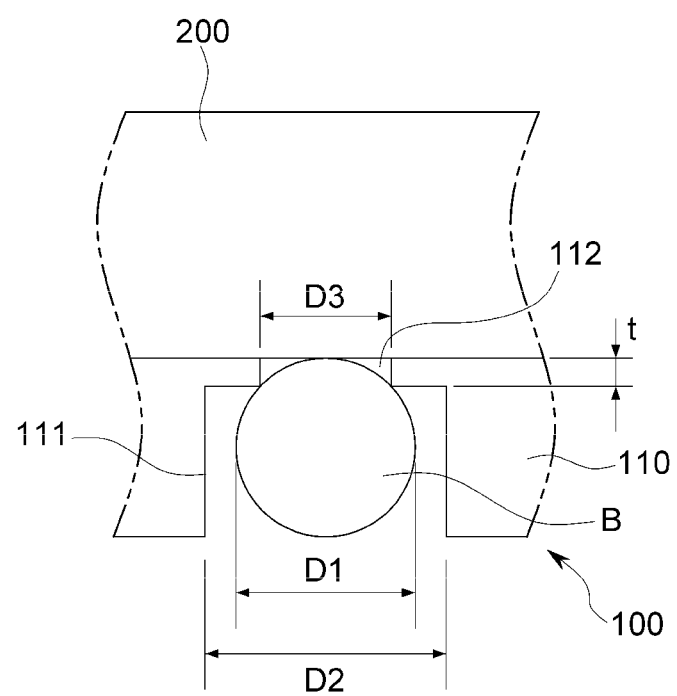
FIG. 2 shows an enlarged view of a mask of a partially enlarged view of a mask of the apparatus for mounting conductive balls of FIG. 1.

The mask 100 is formed in the form of a thin metal plate. Referring to FIG. 2, a plurality of mounting grooves 111 are formed in a mask body 110 in the form of a metal plate. The mask 100 is used to prepare the mounting process by arranging the conductive ball B to be mounted on the substrate 10 at a determined position. The mounting grooves 111 are formed in a portion of the mask body 110 corresponding to the position of the substrate 10 at which the conductive ball B is to be mounted. In order to prevent two or more conductive balls B from being mounted in a single mounting groove of the mounting grooves 111 of the mask 100, the depth of the mounting grooves 111 is approximately equal to or slightly greater than the diameter of the conductive ball B. An inner diameter D2 of each of the mounting grooves 111 may be formed to be greater than an outer diameter D1 of the conductive ball B. The inner diameter D2 of each of the mounting grooves 111 may be smaller than twice the outer diameter D1 of the conductive ball B. A through hole 112 passing through the mask body 110 may be formed inside each of the mounting grooves 111. As illustrated in FIG. 2, an inner diameter D3 of the through hole 112 is smaller than the outer diameter D1 of the conductive ball B. Accordingly, although being inserted into each of the mounting grooves 111, the conductive ball B may be caught by the through hole 112 while not passing through the through hole 112 to determine the position thereof.

When the mask 100 having such a structure is prepared, the mask 100 is horizontally arranged and fixed (step (a)).

In this state, the electrostatic chuck 200 is disposed above the mask 100 (step (b)). The electrostatic chuck 200 may be disposed to contact an upper surface of the mask 100.

Next, as illustrated in FIG. 1, the ball supply module 300 may be disposed under the mask 100 (step (c)). The ball supply module 300 is formed in the form of a container and a plurality of conductive balls B are accommodated therein. The ball supply module 300 may be disposed to be close to the mask 100.

In this state, when the electrostatic chuck 200 is operated to generate an electrostatic force, the conductive ball B accommodated in the ball supply module 300 rises by the electrostatic force and is mounted in each of the mounting grooves 111 of the mask 100 (step (d)).

At this time, a vibrator 400 may be used to help the conductive ball B accommodated in the ball supply module 300 to be mounted in each of the mounting grooves 111. When vibration is applied to the ball supply module 300 by operating the vibrator 400 installed in the ball supply module 300, the conductive ball B accommodated in the ball supply module 300 bounces in all directions (step (g)). Due to the operation of the vibrator 400 as described above, it is more likely for the conductive ball B to approach closer to the mounting grooves 111 of the mask 100. At this time, the electrostatic force of the electrostatic chuck 200 acts as an attractive force that induces the conductive ball B to approach the mounting grooves 111, so that the conductive ball B is accommodated in the mounting grooves 111.

To make the electrostatic force act effectively, the electrostatic chuck 200 may be disposed to contact the upper surface of the mask 100. In this case, the lower surface of the electrostatic chuck 200 may be exposed through the through hole 112 of the mask 100. The conductive ball B is accommodated in the mounting grooves 111 with a sufficient intensity of electrostatic force while being in contact with the electrostatic chuck 200 through the through hole 112. Although the mask 100, which is made of a metal material, is not easily charged by the electrostatic chuck 200, since the electrostatic chuck 200, which has been charged, is exposed through the through hole 112, the conductive ball B may be easily accommodated in the mounting grooves 111. As illustrated in FIG. 2, a depth t of the through hole 112 may be formed such that the conductive ball B is able to be in contact with the electrostatic chuck 200, so as to hold the conductive ball B accommodated in the mounting grooves 111 in the mounted state thereof without falling out or dropping down. The depth t of the through hole 112 is determined by the outer diameter D1 of the conductive ball B and the inner diameter D3 of the through hole 112.

Meanwhile, the strength of the electrostatic force of the electrostatic chuck 200 is adjusted to be an appropriate level by a controller (step (i)). When the electrostatic force of the electrostatic chuck 200 is too strong, two or more conductive balls B may be attached to and around the mounting grooves 111. When the electrostatic force of the electrostatic chuck 200 is too weak, the conductive ball B accommodated in the mounting grooves 111 may not be caught and may fall off. Accordingly, the strength of the electrostatic force of the electrostatic chuck 200 may be adjusted to such a degree that one conductive ball B can be securely accommodated and attached to each of the mounting grooves 111. When the operation of the electrostatic chuck 200 is adjusted to this extent, there is no possibility that the conductive ball B is attached to the lower surface of the mask 100 at a position other than the mounting grooves 111.

As the vibrator 400 for applying vibration to the ball supply module 300, various vibrators may be used as long as the configuration thereof can generate vibration.

As the vibrator 400, a vibrator that makes the space between the lower surface of the mask 100 and the ball supply module 300 to be in a sealed state and blows compressed air, may be used. Likewise, the space between the lower surface of the mask 100 and the ball supply module 300 is made to be in a sealed state and a component such as a rotating rotor or a fan is rotated at an appropriate speed, so as to increase the possibility that the conductive ball B approaches the mounting grooves 111.

In some cases, a camera or other inspection device may be used to identify whether the conductive ball B is mounted on all of the mounting grooves 111 of the mask 100. When the conductive ball B is not mounted in some of the mounting grooves 111, step (d) and step (g) may be performed again to mount the conductive ball B in empty mounting grooves thereof.

Figure 3:
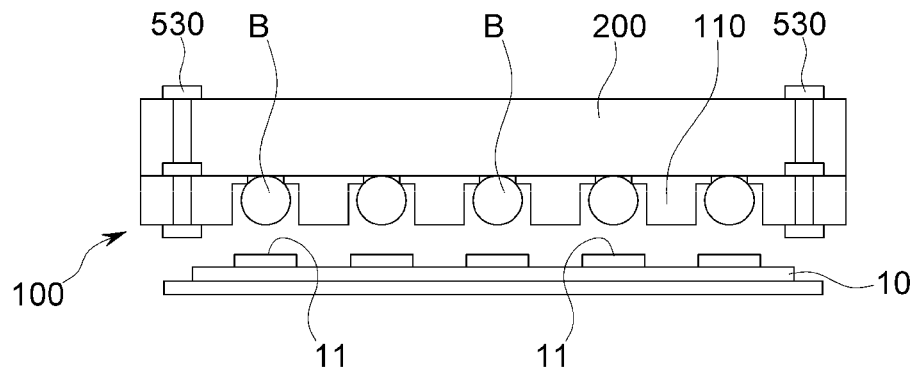
FIGS. 3 and 4 are diagrams for explaining a process of carrying out an example of a conductive ball mounting method using an electrostatic chuck according to the disclosure using the conductive ball mounting apparatus shown in FIG. 1.

When step (d) is completed, that is, when the conductive ball B is mounted in the mounting grooves 111 of the mask 100, the substrate 10 on which the flux is applied is prepared as illustrated in FIG. 3, and at least one of the mask 100 and the substrate 10 is transferred to place the substrate 10 under the mask 100 (step (e)).

The mask 100 may be transferred by a mask transfer unit 510 and disposed above the substrate 10, or the substrate 10 may be transferred by a substrate transfer unit 520 and disposed under the mask 100. The mechanical configuration performing step (e) may be configured in a variety of ways.

FIG. 1 illustrates a case in which the mask 100 and the electrostatic chuck 200 are transferred to the upper side of the substrate 10 in a state in which the substrate 10 has been prepared. In the case of transferring the mask 100, the electrostatic chuck 200 and the mask 100 are transferred together while maintaining the state in which they are in close contact so that the conductive ball B is mounted in the mounting grooves 111 by the electrostatic force of the electrostatic chuck 200.

When the electrostatic chuck 200 is turned off to remove the electrostatic force while the position and direction of the mask 100 and the substrate 10 are aligned, the conductive balls B accommodated in the mounting grooves 111 may fall down onto the substrate 10 (step (h)). Since the flux for attaching the conductive balls B to the substrate 10 is applied to a pad 11, the conductive balls B fall onto the flux and become temporarily bonded by the viscosity of the flux.

Even when the electrostatic force of the electrostatic chuck 200 is removed, some conductive balls B may remain accommodated in the mounting grooves 111 without falling downward due to residual charges remaining in the mask 100. In particular, when the conductive ball B has the size of 100 μm or less, this phenomenon may more likely occur. Although the charge remaining in the mask 100 may be removed by a method such as grounding the mask 100, when the conductive ball B is very small and light, some conductive balls B do not fall off and may be attached onto the mounting grooves 111.

According to the disclosure, in order to drop the conductive ball B accommodated in the mounting grooves 111 of the mask 100 onto the substrate 10, the distance between the electrostatic chuck 200 and the mask 100 may be increased (step (f)).

The drop of the conductive ball B may be induced by increasing the distance between the electrostatic chuck 200 and the mask 100 using a separation member 530 installed between the mask 100 and the electrostatic chuck 200. When the distance between the mask 100 and the electrostatic chuck 200 is increased, the effect of charge or electrostatic force that may remain in the electrostatic chuck 200 is reduced and the effect of the self-weight of the conductive ball B is increased, thereby allowing the conductive ball B to easily drop onto the substrate 10 disposed thereunder. At this time, since the inner diameter D3 of the through hole 112 of the mask 100 is smaller than the outer diameter D1 of the conductive ball B, the conductive ball B is caught by the through hole 112 and thus is separated from the electrostatic chuck 200. By using the mask 100 including the through hole 112 and the mounting grooves 111 as described above, the attachment and separation of the conductive ball B by the electrostatic chuck 200 may be effectively performed. In addition, according to the disclosure, even when very small and light conductive balls B are used, the conductive balls B may be easily mounted in the mounting grooves 111 and if needed, the conductive balls B may easily drop down easily.

Two methods may be used to increase the distance between the electrostatic chuck 200 and the mask 100. The mask may be lowered while the electrostatic chuck is fixed, or on the other hand, the electrostatic chuck 200 may be raised while the mask 100 is fixed.

Figure 4:
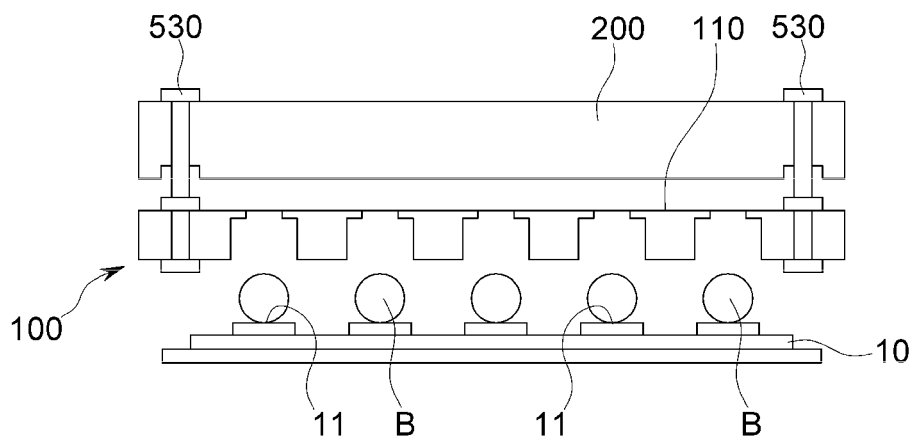

In the present embodiment, as illustrated in FIG. 4, the gap between the mask 100 and the electrostatic chuck 200 is increased by fixing the mask 100 and raising the electrostatic chuck 200.

The conductive balls B temporarily bonded to the substrate 10 are then heated in reflow together with the substrate 10, thereby attaching onto the substrate 10.

Hereinbefore, embodiments of the disclosure have been described. However, the scope of the disclosure is not limited thereto.

For example, in the previous embodiments, the step (f) of dropping the conductive ball B is performed while the electrostatic chuck 200 is turned off. However, in some cases, the step (f) may be performed while the electrostatic force of the electrostatic chuck 200 is maintained. When the distance between the electrostatic chuck 200 and the mask 100 is increased to a distance where the electrostatic force does not act, even when the electrostatic chuck 200 is turned on, the conductive ball B may drop.

In addition, although it has been previously described that the depth t of the through hole 112 is such that the conductive ball B can contact the electrostatic chuck 200, the depth t of the through hole 112 may be greater than the extent. In this case, the conductive ball B may be caught by the through hole 112 but does not come into contact with the electrostatic chuck 200.

The invention claimed is:

1. A method of mounting conductive balls, the method comprising:
   (a) horizontally arranging a mask including: a mask body in the form of a flat plate; a plurality of mounting grooves formed on a lower surface of the mask body to mount conductive balls therein; and a through hole formed inside the mounting groove and passing through the mask body;
   (b) placing an electrostatic chuck above the mask;
   (c) disposing, under the mask, a ball supply module in which a plurality of conductive balls are accommodated;
   (d) mounting the conductive balls accommodated in the ball supply module into the mounting grooves by operating the electrostatic chuck;
   (e) disposing a substrate under the mask by preparing the substrate on which flux is applied and transferring at least one of the mask and the substrate; and
   (f) mounting the conductive balls on the substrate by increasing the distance between the electrostatic chuck and the mask to drop the conductive balls mounted in the mounting grooves of the mask onto the substrate.

2. The method of claim 1, wherein
   (g) applying vibration to the ball supply module by a vibrator so that the conductive balls accommodated in the ball supply module are easily mounted in the mounting grooves when performing the step (d).

3. The method of claim 1, wherein
   (h) removing an electrostatic force by turning off the electrostatic chuck when performing step (f).

4. The method of claim 3, wherein
   in step (b), the electrostatic chuck is arranged such that a lower surface of the electrostatic chuck is brought into contact with a top surface of the mask.

5. The method of claim 4, wherein
   in step (a), an inner diameter of the through hole is smaller than an outer diameter of the conductive ball, and the through hole has such a depth that the conductive ball is brought into contact with the electrostatic chuck.

6. The method of claim 3, wherein
   (i) adjusting the electrostatic force of the electrostatic chuck such that the electrostatic force to mount one conductive ball in each of the mounting grooves of the mask in step (d) is generated in the electrostatic chuck.

7. The method of claim 3, wherein
in the step (f), the mask is lowered while the electrostatic chuck is fixed.
8. The method of claim 3, wherein
in the step (f), the electrostatic chuck is raised while the mask is fixed.
9. The method of claim 2, wherein
(h) removing an electrostatic force by turning off the electrostatic chuck when performing step (f).
10. The method of claim 9, wherein
in step (b), the electrostatic chuck is arranged such that a lower surface of the electrostatic chuck is brought into contact with a top surface of the mask.
11. The method of claim 10, wherein
in step (a), an inner diameter of the through hole is smaller than an outer diameter of the conductive ball, and the through hole has such a depth that the conductive ball is brought into contact with the electrostatic chuck.
12. The method of claim 9, wherein
(i) adjusting the electrostatic force of the electrostatic chuck such that the electrostatic force to mount one conductive ball in each of the mounting grooves of the mask in step (d) is generated in the electrostatic chuck.
13. The method of claim 9, wherein
in the step (f), the mask is lowered while the electrostatic chuck is fixed.
14. The method of claim 9, wherein
in the step (f), the electrostatic chuck is raised while the mask is fixed.

* * * * *